(12) United States Patent
Heo et al.

(10) Patent No.: US 11,292,315 B2
(45) Date of Patent: Apr. 5, 2022

(54) AIR CONDITIONING DEVICE FOR VEHICLE AND METHOD OF CONTROLLING THE SAME

(71) Applicants: Hyundai Motor Company, Seoul (KR); Kia Motors Corporation, Seoul (KR)

(72) Inventors: Jae-Won Heo, Seoul (KR); Jae-Sik Choi, Gyeonggi-do (KR); Jin-Han Kim, Jeollanam-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 324 days.

(21) Appl. No.: 16/697,438

(22) Filed: Nov. 27, 2019

(65) Prior Publication Data
US 2020/0324620 A1 Oct. 15, 2020

(30) Foreign Application Priority Data
Apr. 9, 2019 (KR) .......................... 10-2019-0041370

(51) Int. Cl.
*G06F 3/041* (2006.01)
*B60H 1/00* (2006.01)
*B60K 37/06* (2006.01)
*H03K 17/96* (2006.01)

(52) U.S. Cl.
CPC ......... *B60H 1/00985* (2013.01); *B60K 37/06* (2013.01); *H03K 17/962* (2013.01); *B60K 2370/1434* (2019.05); *B60K 2370/1438* (2019.05)

(58) Field of Classification Search
CPC .............. B60H 1/0065; B60H 1/00985; B60K 2370/1434; B60K 2370/1438; B60K 2370/1446; B60K 37/02; B60K 37/06; H03K 17/96; H03K 17/962; H03K 2217/96015; H03K 2217/96023; H03K 2217/96066
See application file for complete search history.

(56) References Cited

U.S. PATENT DOCUMENTS

2006/0114106 A1* 6/2006 Donk ................... B60H 1/0065
340/449
2010/0327070 A1* 12/2010 Bouchard .......... B60H 1/00985
236/49.3

FOREIGN PATENT DOCUMENTS

EP 2 165 865 A1 3/2010
KR 10-2016-0116853 A 10/2016

* cited by examiner

*Primary Examiner* — Insa Sadio
(74) *Attorney, Agent, or Firm* — Mintz Levin Cohn Ferris Glovsky and Popeo, P.C.; Peter F. Corless

(57) ABSTRACT

An air conditioning device for a vehicle and a method of controlling the same are provided. The air conditioning device includes a touch input unit which is configured to be touched, rotated by 360 degrees, and dragged by a user. A touch sensor unit includes three channel regions formed by trisecting a rotational region of 360 degrees and is configured to detect capacitance in accordance with touch areas of a first channel, a second channel, and a third channel at predetermined positions in the three channel regions. Three channel signal output units output signals from the respective channels in accordance with the recognized capacitance.

11 Claims, 18 Drawing Sheets

AIR CONDITIONING DEVICE FOR VEHICLE AND METHOD OF CONTROLLING THE SAME

CROSS-REFERENCE TO RELATED APPLICATIONS

This application claims priority under 35 U.S.C. § 119 to Korean Patent Application No. 10-2019-0041370, filed on Apr. 9, 2019, the disclosure of which is incorporated herein by reference in its entirety.

BACKGROUND

1. Field of the Invention

The present invention relates to an air conditioning device for a vehicle and a method of controlling the same, and more particularly, to an air conditioning device for a vehicle in which a touch region, which is configured to be touched, rotated by 360 degrees, and dragged by a user, is trisected to output three channel signals based on a touch area, and a method of controlling the same.

2. Description of the Related Art

In general, for an air conditioning device installed in a vehicle, setting of an indoor temperature, control of a discharge direction or a discharge amount of cold air, control of a recirculation mode or a fresh air mode are operated by a driver. The driver operates the air conditioning device or performs a simple operation when the vehicle is stopped, or sometimes a person seated in an auxiliary seat operates the air conditioning device while the vehicle is being driven.

Since the driving operation may be interrupted when the driver operates the air conditioning device while the vehicle is being driven at a predetermined speed or greater, there is a need for a technology capable of operating the air conditioning device without affecting the driving operation. When a regional division method in the related art is applied, which divides a drag touch region of a control panel of an air conditioning device for a vehicle for respective steps, it is difficult to perform a precise operation at an interval of 0.5, and the number of touch sensor integrated circuits (IC) is increased due to an increase in number of signals.

SUMMARY

The present invention provides an air conditioning device installed in a vehicle, in which a touch region of a temperature/air-flow-rate adjusting unit, which is configured to be touched, rotated by 360 degrees, and dragged by a user, is trisected to output three channel signals based on a touch area, and thus, a drag adjustment angle may be freely tuned and the number of touch integrated circuits may be reduced, and a method of controlling the same.

Technical problems to be solved by the present disclosure are not limited to the above-mentioned technical problems, and other technical problems, which are not mentioned above, may be clearly understood from the following descriptions by those skilled in the art to which the present disclosure pertains.

An exemplary embodiment of the present invention provides an air conditioning device for a vehicle that may include: a touch input unit which is configured to be touched, rotated by 360 degrees, and dragged by a user; a touch sensor unit having three channel regions formed by trisecting a rotational region of 360 degrees and configured to detect capacitance in accordance with touch areas of a first channel, a second channel, and a third channel at predetermined positions in the three channel regions; and three channel signal output units configured to output signals from the respective channels in accordance with the recognized capacitance.

Each of the three channel regions formed by trisecting the rotational region of 360 degrees may be implemented in the form of a hook including the rotational region in which only one channel is recognized. The three channel signal output units may be connected to a printed circuit board (PCB) together with two grounded parts. The recognized capacitance may be converted into a value of about 0 to 255, and the value may be transmitted to a controller of the air conditioning device for a vehicle. The touch sensor unit may be configured such that predetermined gaps are formed at boundary portions between the three channel regions. The signals may be outputted from the respective channels in proportion to the touch areas of the first channel, the second channel, and the third channel.

Another exemplary embodiment of the present invention provides a method of operating an air conditioning device for a vehicle that may include: storing a predetermined temperature; storing a currently set temperature; receiving a user's touch operation; determining whether the user performs a drag operation after the touch operation; determining whether the drag operation is performed in a temperature increasing direction in response to determining that the user performs the drag operation; determining whether the current temperature is set to a lower temperature LO in response to determining that the drag operation is performed in the temperature increasing direction, changing the temperature to the predetermined temperature when the current temperature is set to the lower temperature LO, and changing the temperature to a higher temperature HI when the current temperature is not set to the lower temperature LO; and determining whether the current temperature is set to the higher temperature HI in response to determining that the drag operation is not performed in the temperature increasing direction, changing the temperature to the predetermined temperature when the current temperature is set to the higher temperature HI, and changing the temperature to the lower temperature LO when the current temperature is not set to the higher temperature HI.

The method may further include: determining whether the user's touch operation is a touch operation for increasing the temperature in response to determining that the drag operation is not performed in the determining of whether the user performs the drag operation after the touch operation; increasing the temperature by 0.5° C. when the user's touch operation is the touch operation for increasing the temperature; and decreasing the temperature by 0.5° C. when the user's touch operation is not the touch operation for increasing the temperature.

Still another exemplary embodiment of the present invention provides a method of controlling an air conditioning device for a vehicle that may include: storing a currently set temperature; receiving a user's touch operation; determining whether the user performs a drag operation after the touch operation; determining whether the drag operation is performed in a temperature increasing direction in response to determining that the user performs the drag operation; determining whether the current temperature is set to a higher temperature HI in response to determining that the drag operation is performed in the temperature increasing direction, maintaining the higher temperature HI when the current temperature is set to the higher temperature HI, and increasing a temperature by 0.5° C. when the current temperature is not set to the higher temperature HI; and determining whether the current temperature is set to a lower temperature LO in response to determining that the drag operation is not performed in the temperature increasing direction, maintaining the lower temperature LO when the current temperature is set to the lower temperature LO, and decreasing the temperature by 0.5° C. when the current temperature is not set to the lower temperature LO.

The method may further include: determining whether the user's touch operation is stopped after increasing of the temperature by 0.5° C. and decreasing of the temperature by 0.5° C.; and returning the process to the determining of whether the user performs the drag operation after the touch operation when the user's touch operation is not stopped.

The method may further include: determining whether the user's touch operation is a touch operation for increasing the temperature in response to determining that the drag operation is not performed in the determining of whether the user performs the drag operation after the touch operation; increasing the temperature by 0.5° C. when the user's touch operation is the touch operation for increasing the temperature; and decreasing the temperature by 0.5° C. when the user's touch operation is not the touch operation for increasing the temperature.

The effects of an air conditioning device for a vehicle and a method of controlling the same according to the present invention will be described below.

First, five touch ICs are required for the region division method in the related art, however, in the present invention the region of 360 degrees is trisected so that the regions of the three channels are disposed differently, and thus, the number of touch ICs may be reduced to three in comparison with the related art.

Second, according to the drag touch technology according to the present invention, it may be possible to freely tune the drag adjustment angle.

The effects obtained by the present disclosure are not limited to the aforementioned effects, and other effects, which are not mentioned above, will be clearly understood by those skilled in the art from the following description.

BRIEF DESCRIPTION OF THE DRAWINGS

The following accompanying drawings are provided to help understand the present invention, and exemplary embodiments of the present invention are provided together with the detailed description. However, technical features of the present invention are not limited to the particular drawings, and the features illustrated in the respective drawings may be combined to constitute a new exemplary embodiment.

DETAILED DESCRIPTION

Figure 1:
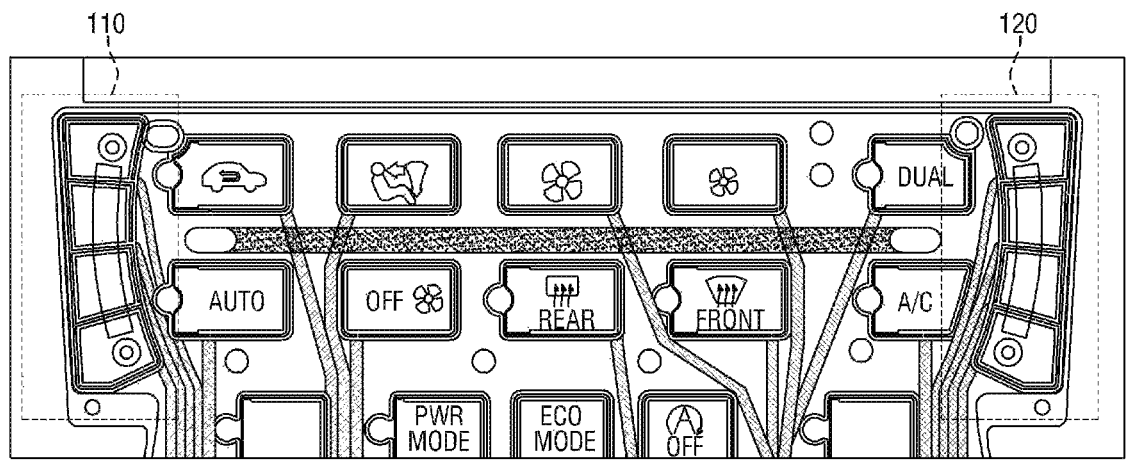
FIG. 1 is a view illustrating a control panel of an air conditioning device for a vehicle in which a drag touch region is divided for respective steps in the related art; [NOTE: If possible, please provide a line drawing of FIG. 1.]

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, the present invention will be described in detail with reference to the accompanying drawings. However, the present invention is not restricted or limited by exemplary embodiments. Like reference numerals indicated in the respective drawings refer to members which perform substantially the same functions.

An object and an effect of the present invention may be naturally understood or may become clearer from the following description, and the object and the effect of the present invention are not restricted only by the following description. In addition, in the description of the present invention, the specific descriptions of publicly known technologies related with the present invention will be omitted when it is determined that the specific descriptions may unnecessarily obscure the subject matter of the present invention.

FIG. 1 is a view illustrating a control panel of an air conditioning device for a vehicle in which a drag touch region is divided for respective steps in the related art. Referring to FIG. 1, a drag touch region of each of adjustment units disposed at left and right sides 110 and 120 of a display panel is divided into four regions for respective steps. With this region division method, there is a drawback in that the number of signals is increased and thus the number of touch ICs is increased.

Figure 2:
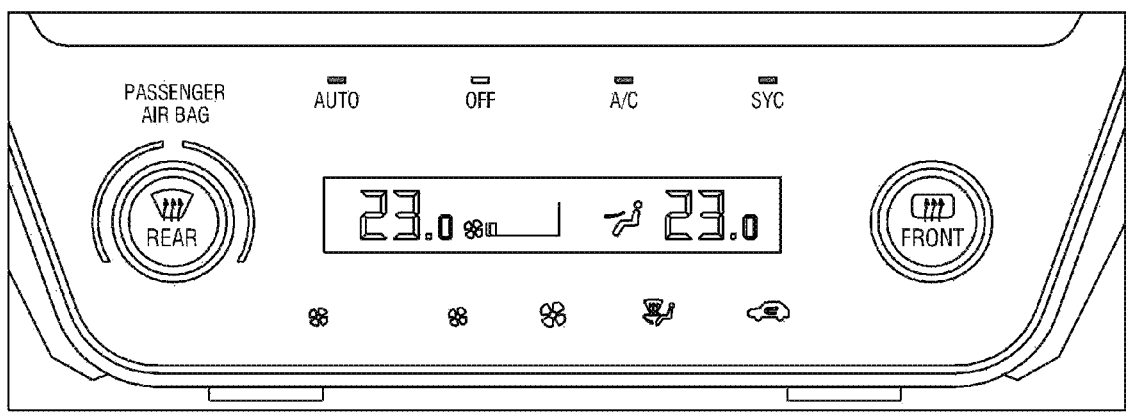
FIG. 2 is a view illustrating a shape of a control panel of an air conditioning device for a vehicle according to an exemplary embodiment of the present invention; [NOTE: If possible, please provide a line drawing of FIG. 2.]

FIG. 2 is a view illustrating a shape of a control panel of an air conditioning device for a vehicle according to an exemplary embodiment of the present invention. In FIG. 2, a component, to which a drag touch technology according to the exemplary embodiment of the present invention is applied, is temperature/air-flow-rate adjusting units disposed at left and right sides, respectively.

Figure 3A:
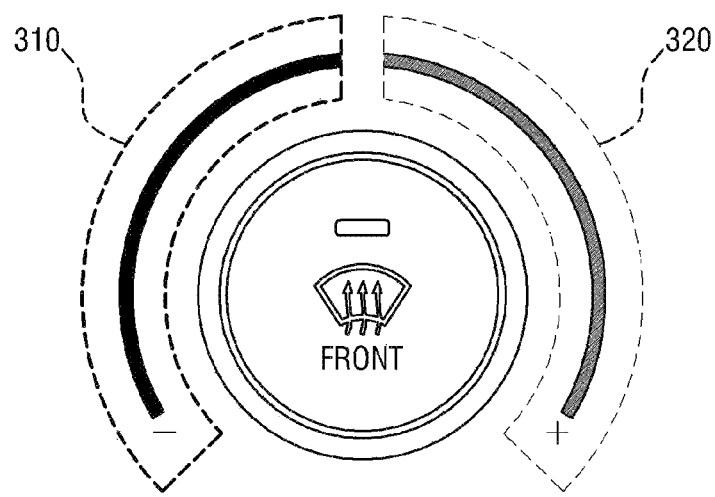
FIGS. 3A and 3B are schematic views illustrating a touch operation and a drag operation performed on a temperature/air-flow-rate adjusting unit of the control panel illustrated in FIG. 2 according to an exemplary embodiment of the present invention.
Figure 3B:
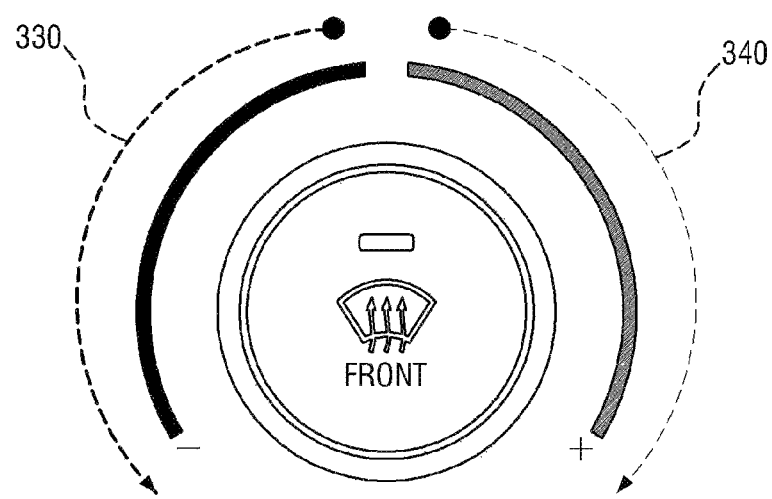

In this regard, FIGS. 3A and 3B are schematic views illustrating a touch operation and a drag operation performed on the temperature/air-flow-rate adjusting unit of the control panel illustrated in FIG. 2. FIG. 3A is a schematic view illustrating the touch operation, and a temperature may be decreased by 0.5° C. by touching a predetermined portion of a left temperature decrease region 310 illustrated in FIG. 3A. In addition, the temperature may be increased by 0.5° C. by touching a predetermined portion of a right temperature increase region 320 illustrated in FIG. 3A.

Meanwhile, FIG. 3B is a schematic view illustrating a touch operation and a drag operation, and the temperature may be decreased to a lower temperature LO by touching a predetermined portion of a left temperature decrease region 330 illustrated in FIG. 3B and then dragging the predetermined portion in the direction of the arrow. In addition, the temperature may be increased to a higher temperature HI by touching a predetermined portion of a right temperature increase region 340 illustrated in FIG. 3B and then dragging the predetermined portion in the direction of the arrow.

According to an exemplary embodiment of the present invention, a setting temperature of an air conditioning device ranges from 17.5° C. to 31.5° C., wherein a lower temperature LO is displayed when a setting temperature of 17.5° C. is decreased by one step and a higher temperature HI is displayed when a setting temperature of 31.5° C. is increased by one step.

According to another exemplary embodiment of the present invention, setting temperature of an air conditioning device ranges from 17.5° C. to 26.5° C., wherein a lower temperature LO is displayed when a setting temperature of 17.5° C. is decreased by one step and a higher temperature HI is displayed when a setting temperature of 26.5° C. is increased by one step.

Figure 4A:
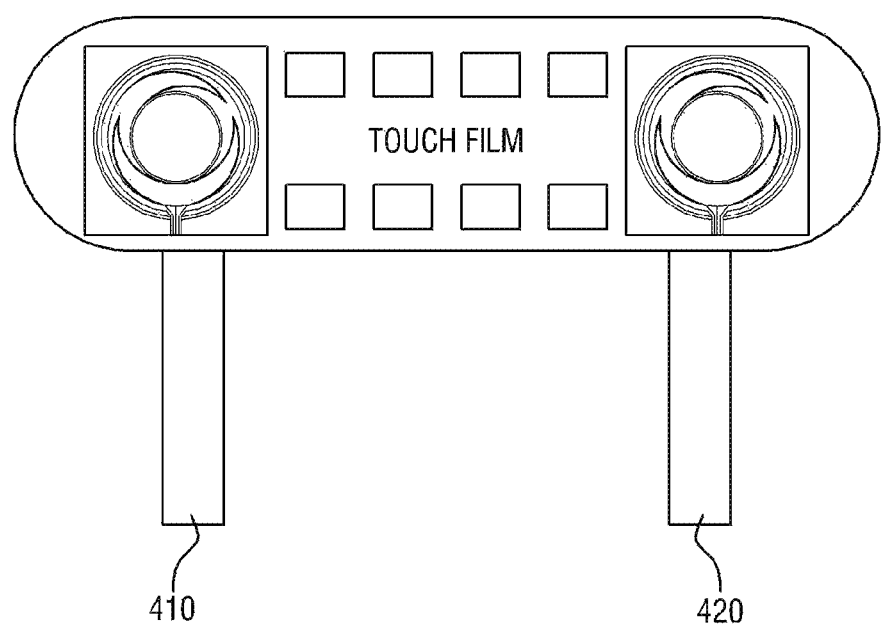
FIG. 4A is a schematic view illustrating a connection relationship between a PCB and the control panel of the air conditioning device for a vehicle according to the exemplary embodiment of the present invention.

FIG. 4A is a schematic view illustrating a connection relationship between a PCB and the control panel of the air conditioning device for a vehicle according to the exemplary embodiment of the present invention. As illustrated in FIG. 4A, in the air conditioning device for a vehicle according to the exemplary embodiment of the present invention, parts 410 and 420, through which signals are output from the temperature/air-flow-rate adjusting units positioned at the left and right sides of the control panel, may be connected to a printed circuit board (PCB). The temperature/air-flow-rate adjusting unit according to the present invention may include a touch sensor unit, and a detailed configuration thereof is illustrated in FIG. 4B.

Figure 4B:
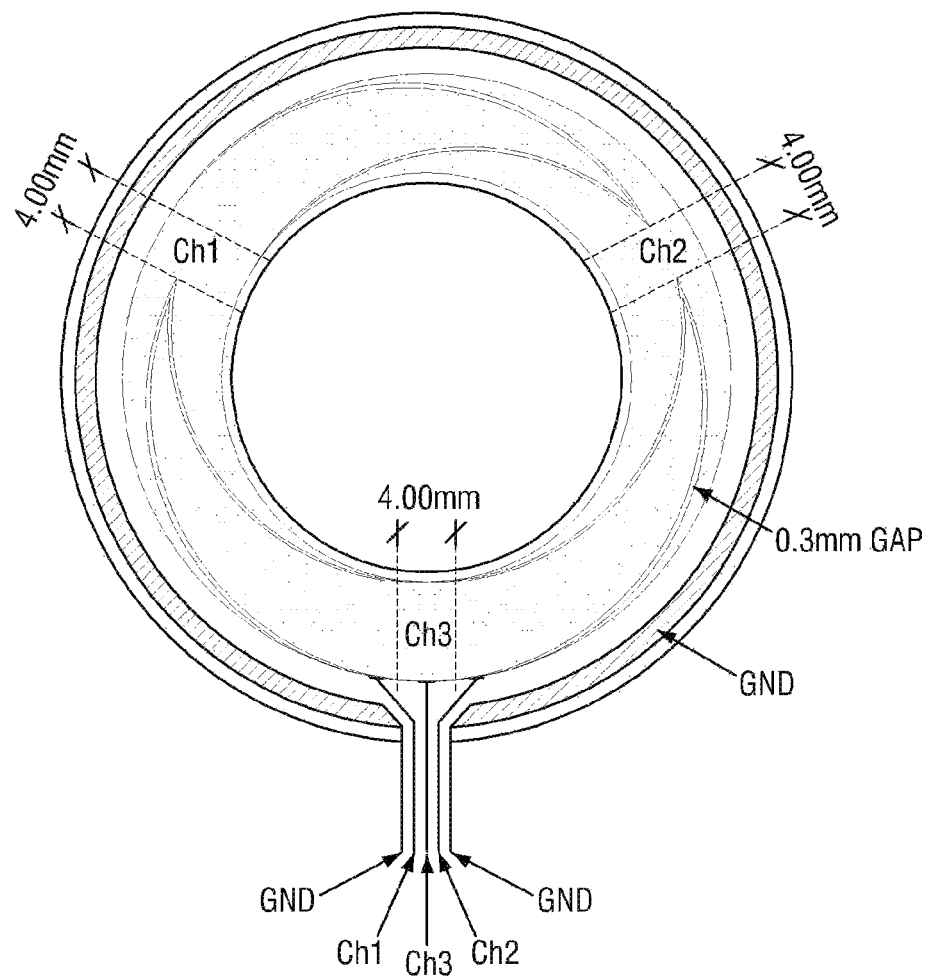
FIG. 4B is a detailed configuration view illustrating a state in which a region of 360 degrees of a touch sensor unit of the air conditioning device for a vehicle according to the exemplary embodiment of the present invention is trisected so that regions of three channels are disposed differently.

FIG. 4B is a detailed configuration view illustrating a state in which a region of 360 degrees of the touch sensor unit of the air conditioning device for a vehicle according to the exemplary embodiment of the present invention is trisected so that regions of three channels CH1, CH2, and CH3 are disposed differently. Referring to FIG. 4B, the touch sensor unit is configured such that the region of 360 degrees is trisected into the three channels, that is, a first channel CH1, a second channel CH2, and a third channel CH3.

More specifically, as illustrated in FIG. 4B, each of the channel regions may have a maximum sensor area at a predetermined rotational interval (e.g., an interval of about 4.00 mm) and may be formed in the shaped of a hook such with sensor area of the channel gradually decreasing in a clockwise or counterclockwise rotation direction. A predetermined gap (e.g., about 0.3 mm) may be formed between the channel regions. Signal output units, which output signals from the three channel regions, are designed to have three lines, one line for each channel region, the signal output units having the three channels CH1, CH2, and CH3 are connected to the printed circuit board PCB together with two grounded parts GND.

Figure 4C:
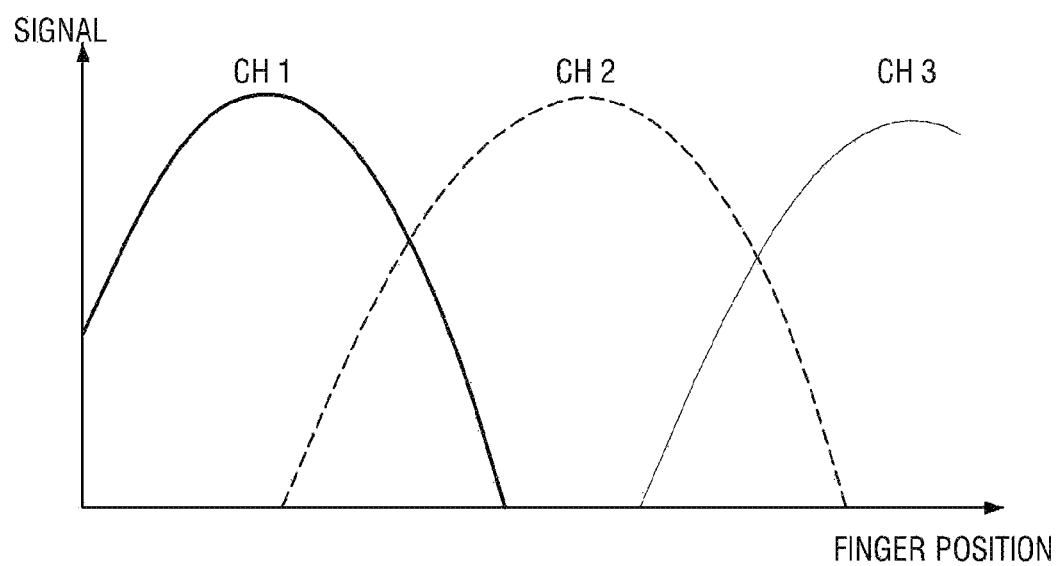
FIG. 4C is a graph illustrating output signal values in respect to the respective channels in accordance with a finger position on the touch sensor unit illustrated in FIG. 4B according to an exemplary embodiment of the present invention.

FIG. 4C is a graph illustrating output signal values in respect to the respective channels in accordance with a finger position on the touch sensor unit illustrated in FIG. 4B. The graph illustrated in FIG. 4C shows that the signal value of the channel is largest when a finger is positioned at the predetermined rotational interval (e.g., the interval of about 4.00 mm) at which the channel region has a maximum sensor area, and the signal value is gradually decreased as a finger position is shifted therefrom. The capacitance may be detected in accordance with the sensor area of each of the channels at each position when the user's finger is positioned at a predetermined position as described above, the capacitance may be converted into a value of, for example, about 0 to 255, and the value may be transmitted to a controller of the air conditioning device.

Figure 5A:
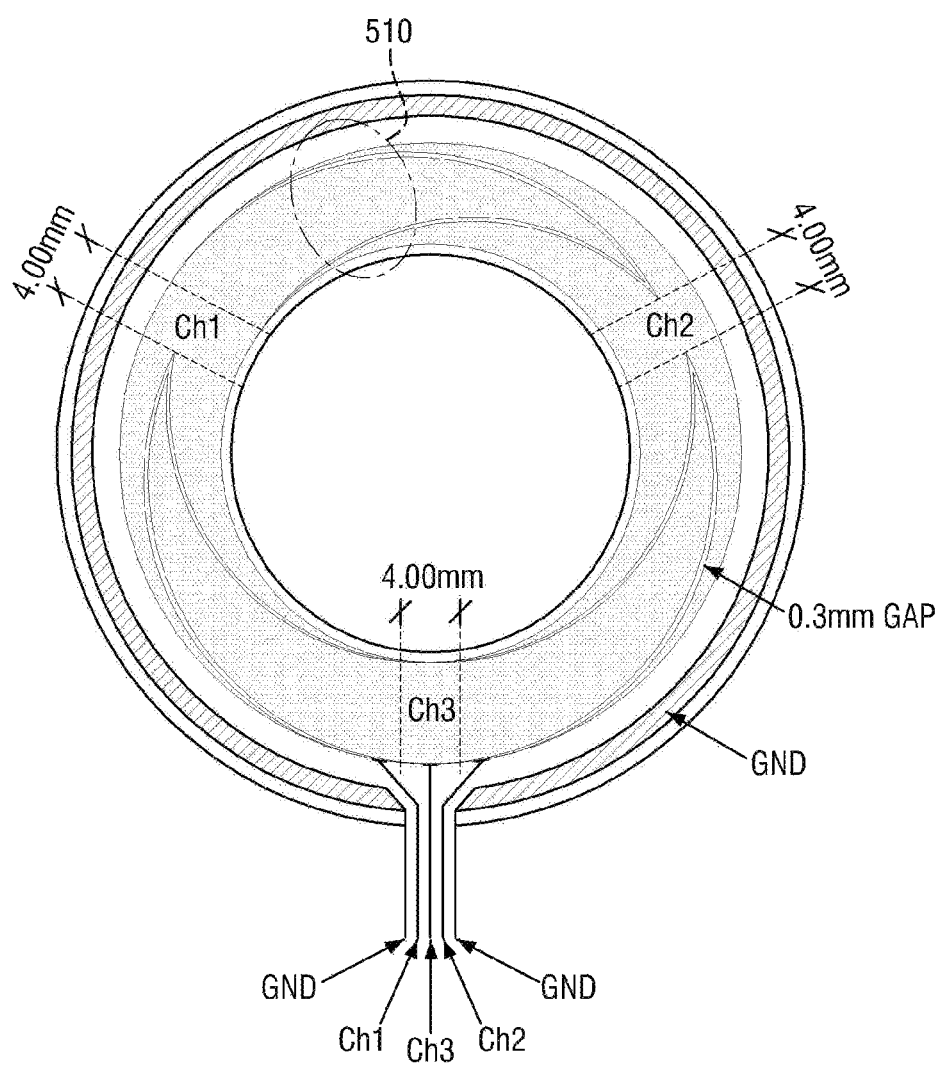
FIG. 5A is a configuration view illustrating a finger touch portion according to the exemplary embodiment of the present invention with reference to the detailed configuration view illustrated in FIG. 4B.
Figure 5B:
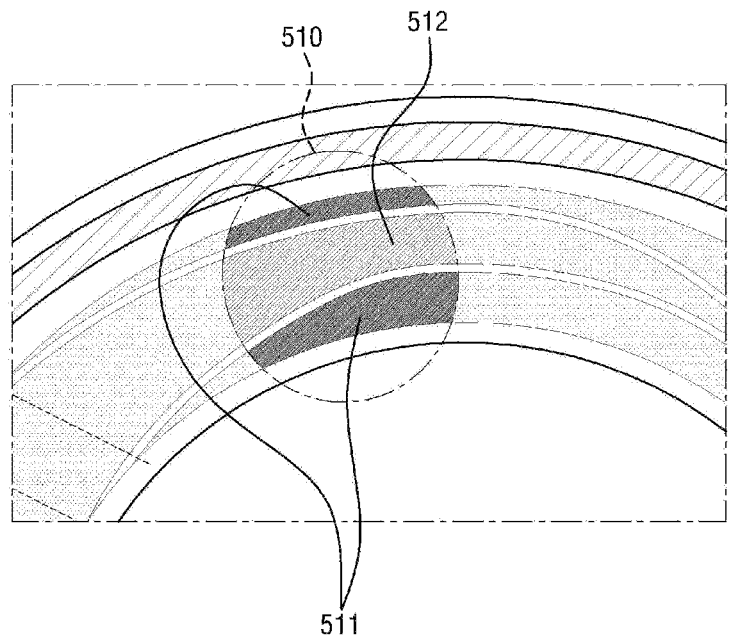
FIG. 5B is an enlarged view illustrating the finger touch portion illustrated in FIG. 5A according to an exemplary embodiment of the present invention.

FIG. 5A is a configuration view illustrating a finger touch portion according to the exemplary embodiment of the present invention with reference to the detailed configuration view illustrated in FIG. 4B, and FIG. 5B is an enlarged view illustrating the finger touch portion illustrated in FIG. 5A. FIG. 5A illustrates a finger touch portion 510 on the touch sensor unit illustrated in FIG. 4B. Referring to FIG. 5B illustrating an enlarged view of the finger touch portion 510, a signal from the second channel CH2, which is detected in proportion to a finger touch area, that is, the capacitance in respect to a sensor area 511 of the second channel may be, for example, 5, and a signal from the first channel CH1, which is detected in proportion to the finger touch area, that is, the capacitance in respect to a sensor area 512 of the first channel may be, for example, 10.

Figure 5C:
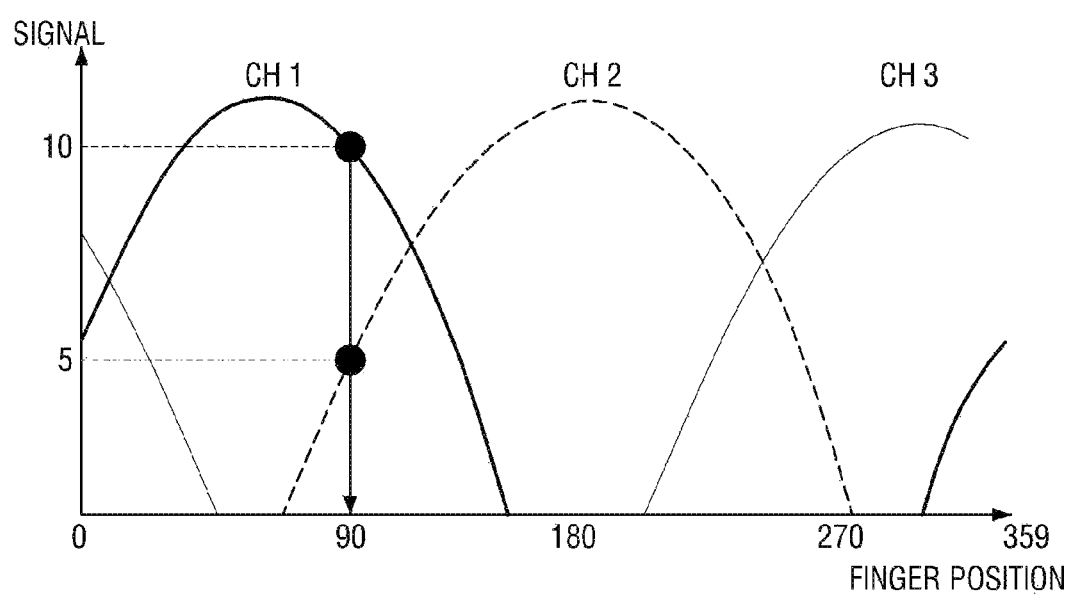
FIG. 5C is a graph illustrating output signal values in respect to the respective channels in accordance with a finger position on the touch sensor unit illustrated in FIG. 5A according to an exemplary embodiment of the present invention.
Figure 5D:
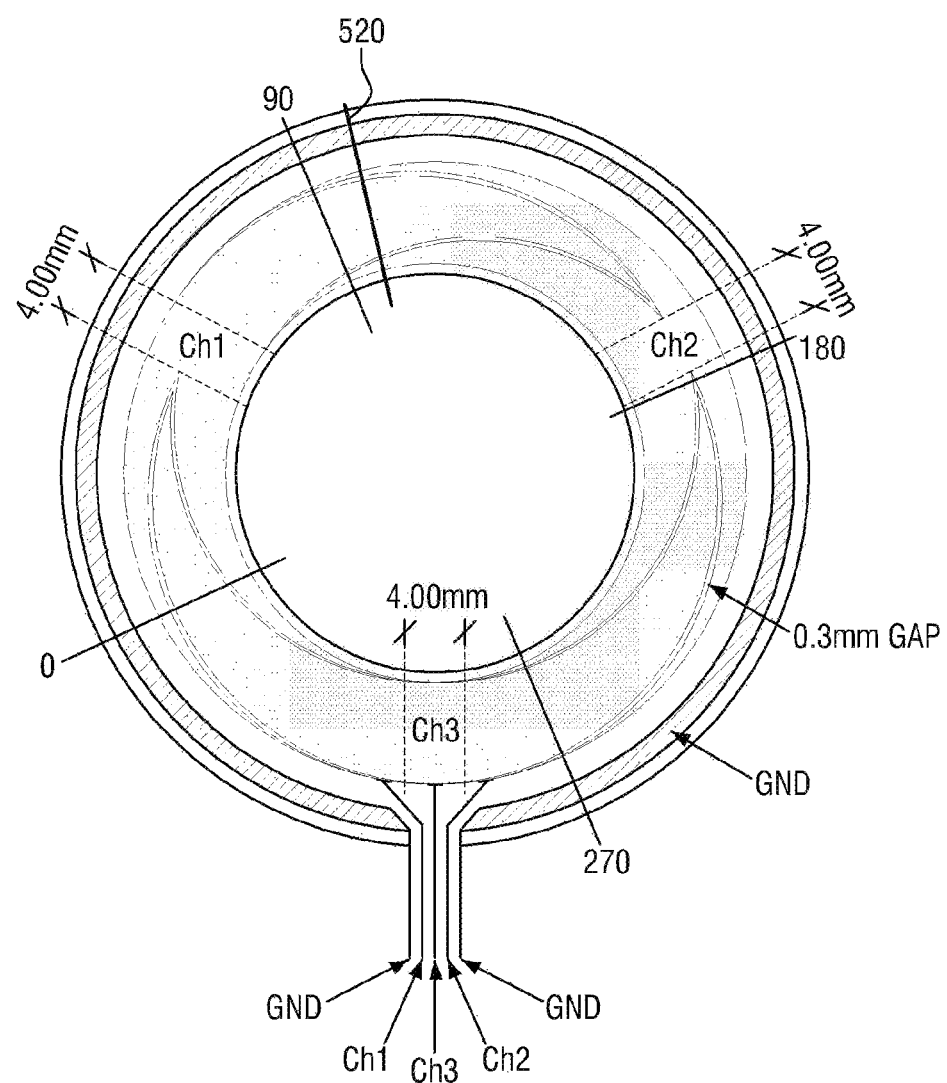
FIG. 5D is a configuration view illustrating parts of the finger touch portion illustrated in FIGS. 5A and 5B that recognize the finger positions according to an exemplary embodiment of the present invention.
Figure 6A:
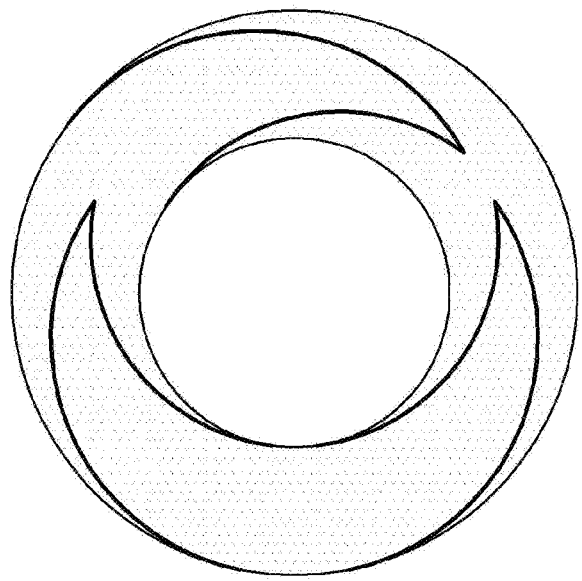
FIGS. 6A to 6M are schematic views illustrating trisected shapes of the touch sensor unit according to the exemplary embodiment of the present invention.
Figure 6B:
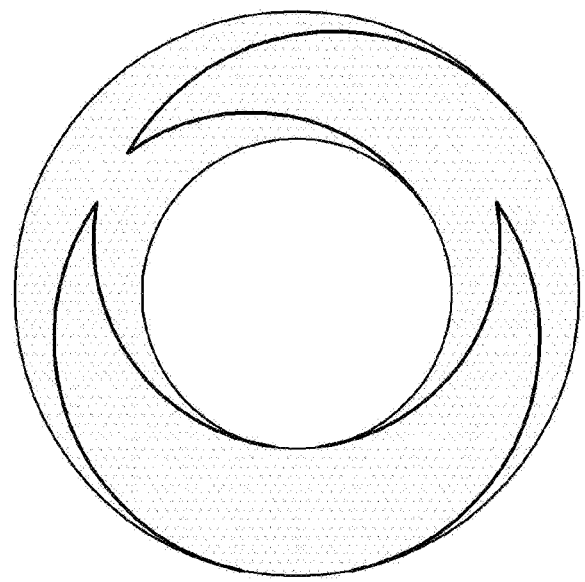
Figure 6C:
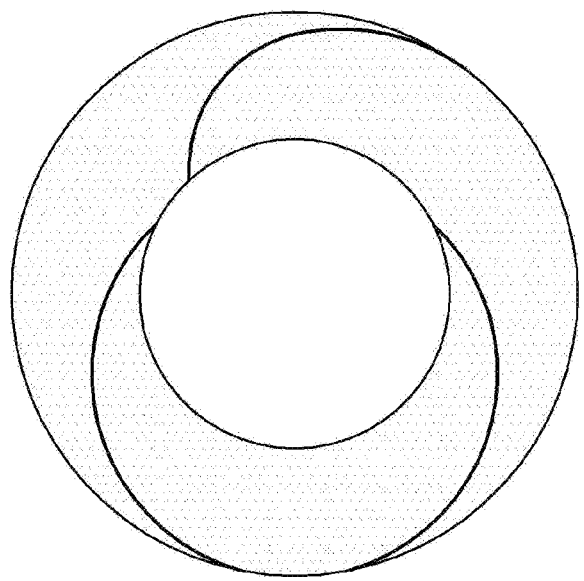
Figure 6D:
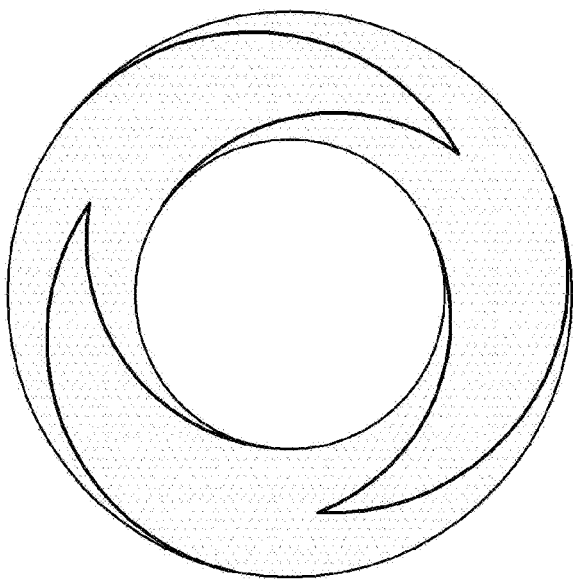
Figure 6E:
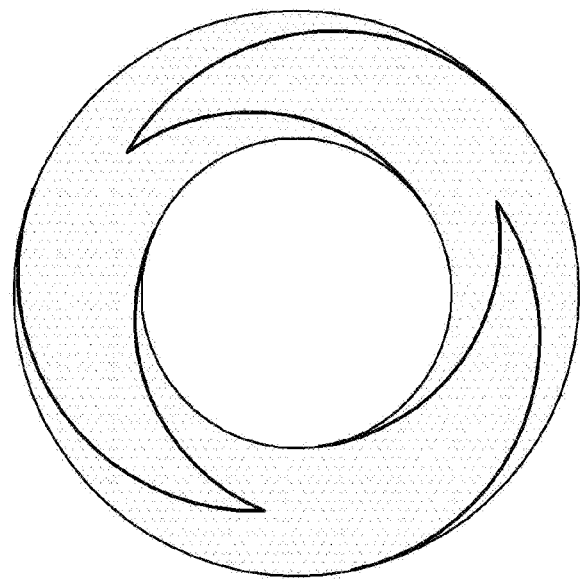
Figure 6F:
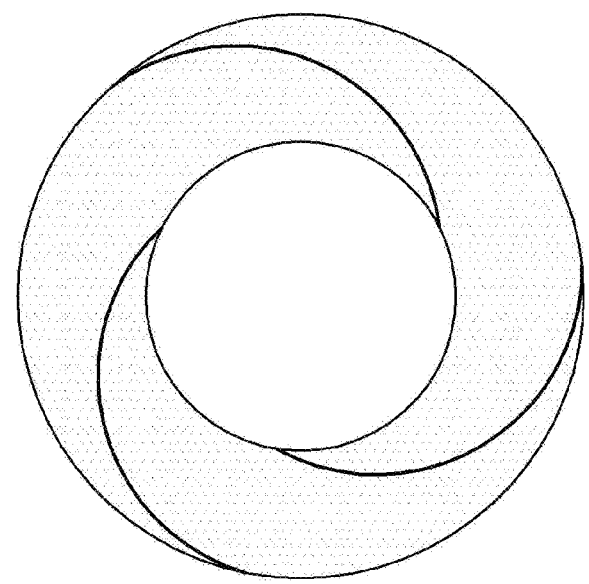
Figure 6G:
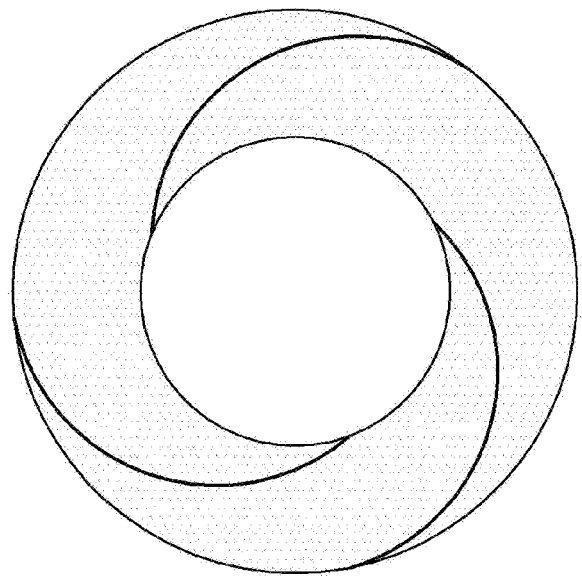
Figure 6H:
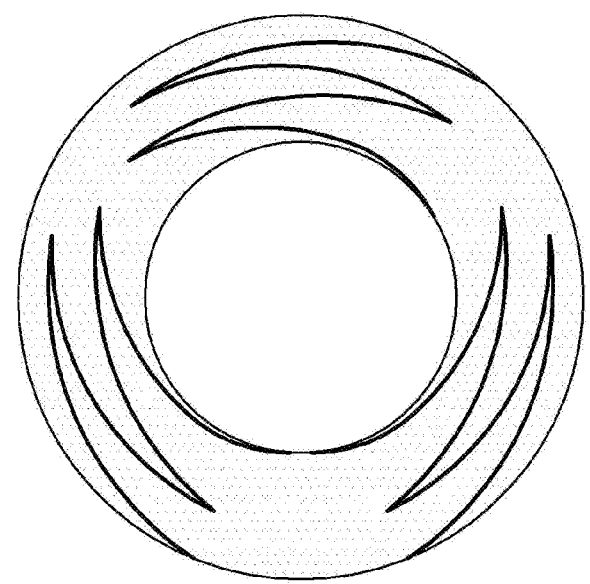
Figure 6I:
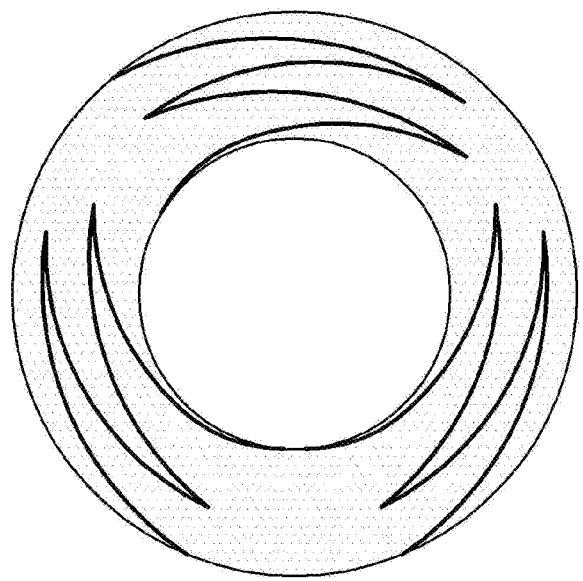
Figure 6J:
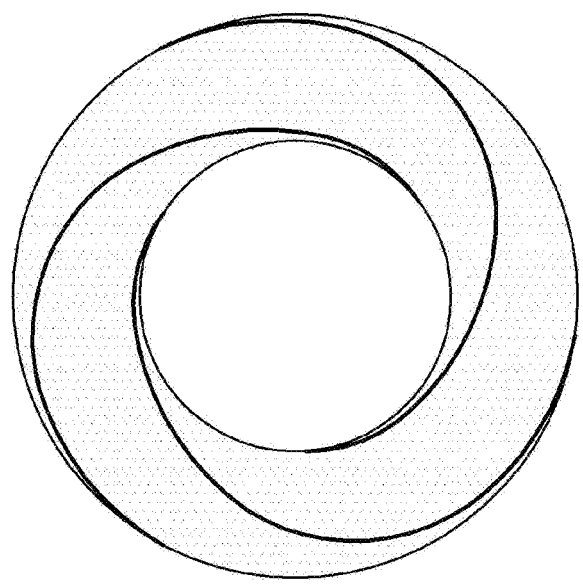
Figure 6K:
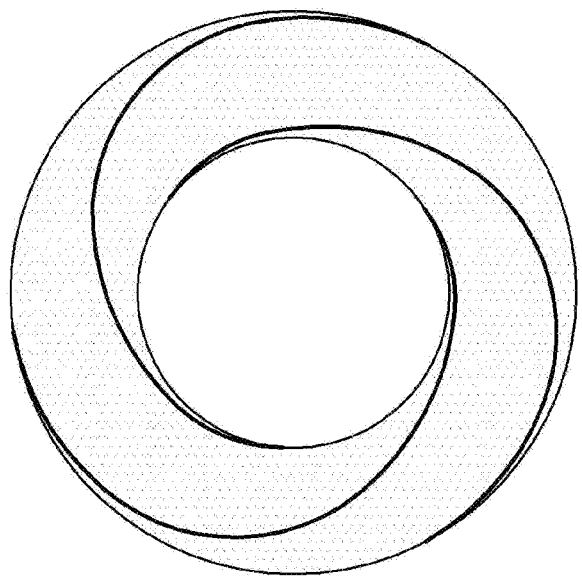
Figure 6L:
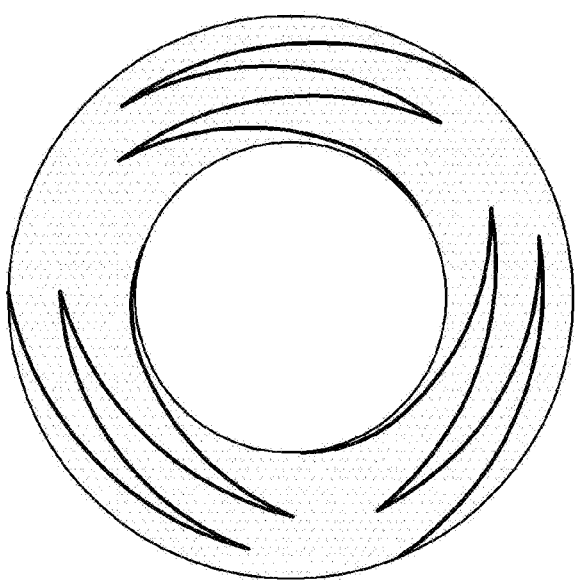
Figure 6M:
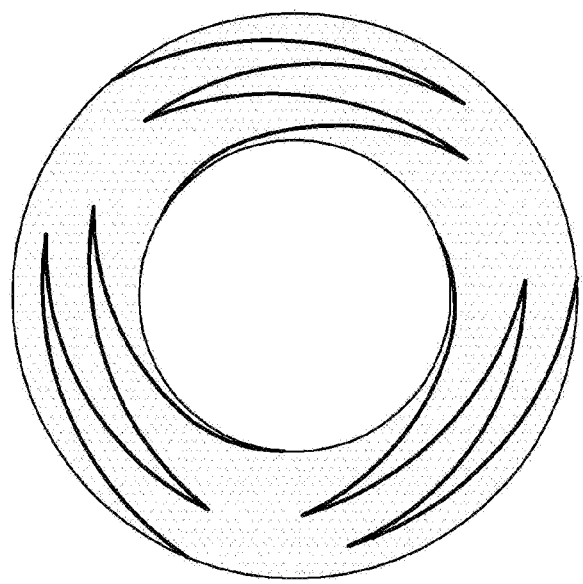

In this regard, FIG. 5C is a graph illustrating output signal values in respect to the respective channels in accordance with a finger position on the touch sensor unit illustrated in FIG. 5A. Referring to FIG. 5C, for example, a point at which the signal value of the first channel CH1 is 10 and the signal value of the second channel CH2 is 5, that is, a point which is rotated by about 90 degrees from a position of 0 degree in a rotational region of 360 degrees is a position touched by the finger. As illustrated in FIG. 5D, the finger touch position may be detected as a point 520 which is rotated by about 90 degrees from the position of 0 degree.

FIGS. 6A to 6H are schematic views illustrating trisected shapes of the touch sensor unit according to the exemplary embodiment of the present invention. As illustrated in FIGS. 6A to 6H, the trisected channel regions of the touch sensor unit may be implemented in various different forms, and the forms thereof are not limited to the forms illustrated in FIGS. 6A to 6H.

Figure 7A:
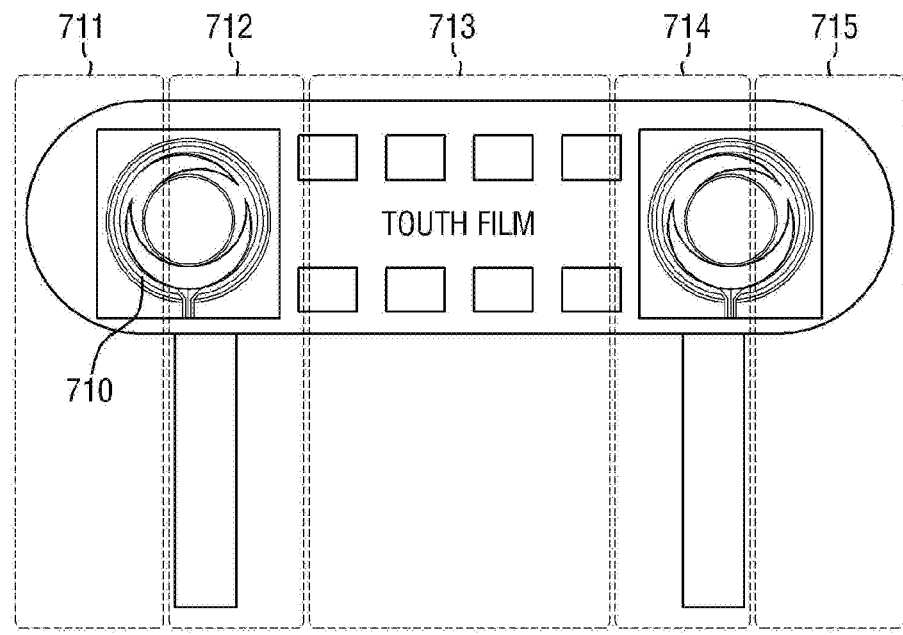
FIG. 7A is a view illustrating configurations of touch ICs to which a technology in the related art is applied.
Figure 7B:
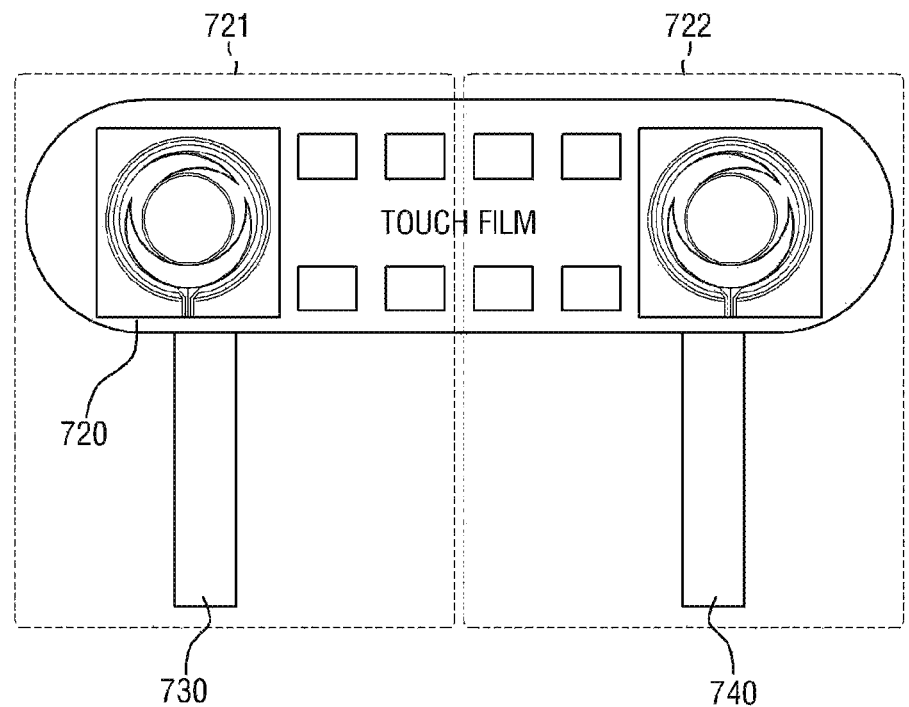
FIG. 7B is a view illustrating configurations of touch ICs to which a technology according to the exemplary embodiment of the present invention is applied.

FIG. 7A is a view illustrating configurations of touch ICs to which a technology in the related art is applied, and FIG. 7B is a view illustrating configurations of touch ICs to which the technology according to the exemplary embodiment of the present invention is applied. In particular, the number of output signals is greater in the region division method in the related art, that is, in the region division method in which the drag touch region is divided for respective steps as illustrated in FIG. 1 compared to the number of output signals when one line is provided for each channel region as taught by the present invention.

For example, 32 signals 720 may be output from the left temperature/air-flow-rate adjusting unit 110 illustrated in FIG. 1. As a result, as illustrated in FIG. 7A, the number of touch ICs 711, 712, 713, 714, and 715 is increased. However, when the drag touch technology according to the exemplary embodiment of the present invention is applied, the number of signals is less than the number of signals in the technology of the related art. For example, 5 signals (i.e., CH1, CH2, CH3, and two GNDs) 720 may be output from the touch sensor unit illustrated in FIG. 4B. As a result, as illustrated in FIG. 7B, the number of touch ICs 721 and 722 may be decreased, and a drag adjustment angle may be freely tuned.

Figure 8:
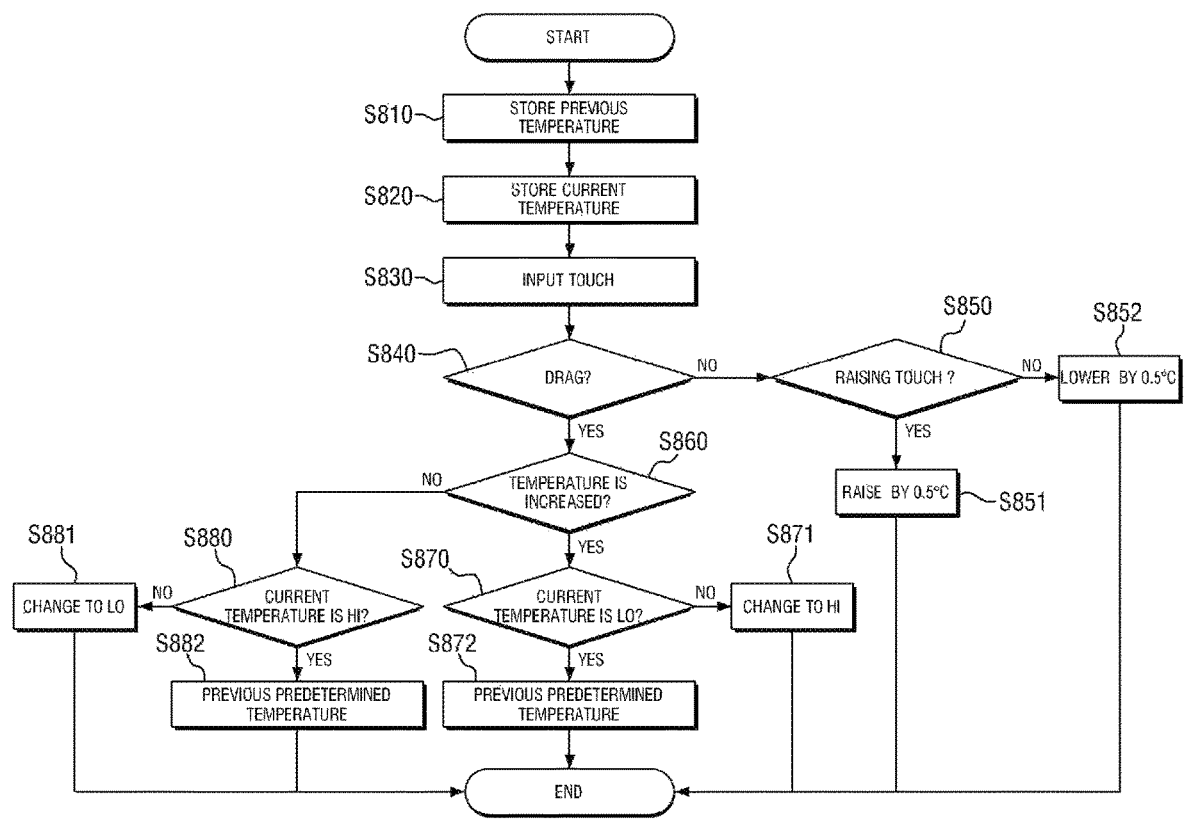
FIG. 8 is a flowchart for explaining a three-step control method of the air conditioning device for a vehicle according to the exemplary embodiment of the present invention.

FIG. 8 is a flowchart illustrating a three-step control method of the air conditioning device for a vehicle according to the exemplary embodiment of the present invention. The three-step control method will be described below for each step. The method discussed herein below may be executed by a controller.

First, in step S810, a predetermined temperature may be stored in the air conditioning device for a vehicle including the touch operating unit configured to be touched, rotated by 360 degrees, and dragged by the user. Thereafter, in step S820, the air conditioning device for a vehicle may be configured to store a currently set temperature. The user's touch operation may be input in step S830, and then whether the user performs the drag operation after the touch operation may be determined in step S840. In response to determining from the determination result in step S840 that the user performs the drag operation, the process goes to step S860, and whether the drag operation is performed in a temperature increase direction may be determined.

In response to determining from the determination result in step S860 that the drag operation is performed in the temperature increase direction, whether a current temperature is set to the lower temperature LO may be determined in step S870. The temperature may be changed, in step S872, to the temperature predetermined in step S810 when the current temperature is set to the lower temperature LO, and the temperature may be changed, in step S871, to the higher temperature HI when the current temperature is not set to the lower temperature LO (e.g., is set to greater than LO).

In response to determining from the determination result in step S860 that the drag operation is not performed in the temperature increase direction, whether the current temperature is set to the higher temperature HI may be determined in step S880. The temperature may be changed, in step S882, to the temperature predetermined in step S810 when the current temperature is set to the higher temperature HI, and the temperature may be changed, in step S881, to the lower temperature LO when the current temperature is not set to the higher temperature HI.

Meanwhile, in response to determining from the determination result in step S840 that the user does not perform the drag operation after the touch operation, the process may proceed to step S850, and whether the user's touch operation is a touch operation for increasing a temperature may be determined. The temperature may be increased by 0.5° C. (S851) in response to determining from the determination result in step S850 that the user's touch operation is the operation for increasing the temperature, and the temperature may be decreased by 0.5° C. (S852) when the user's touch operation is not the operation for increasing the temperature.

Figure 9:
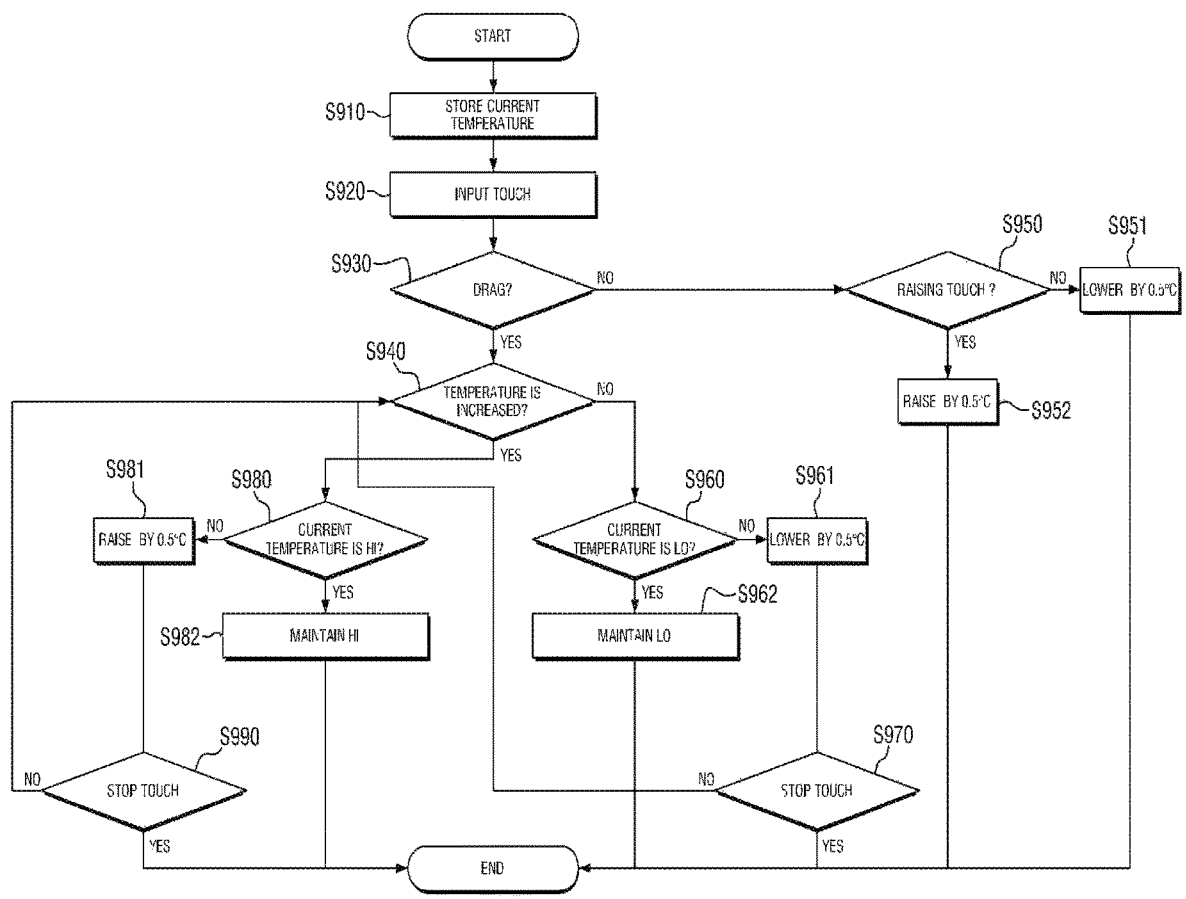
FIG. 9 is a flowchart for explaining a method of controlling the air conditioning device for a vehicle according to the exemplary embodiment of the present invention.

FIG. 9 is a flowchart for explaining a method of accurately controlling the air conditioning device for a vehicle according to the exemplary embodiment of the present invention. The control method will be described below for each step.

First, in step S910, a currently set temperature may be stored in the air conditioning device for a vehicle including the touch operating unit configured to be touched, rotated by 360 degrees, and dragged by the user. Next, the user's touch operation may be input in step S920, and then whether the user performs the drag operation after the touch operation may be determined in step S930. In response to determining from the determination result in step S930 that the drag operation is performed, the process may proceed to step S940, and whether the drag operation is performed in the temperature increase direction may be determined.

In response to determining from the determination result in step S940 that the drag operation is performed in the temperature increase direction, the process may proceed to step S980, and whether the current temperature is set to the higher temperature HI may be determined. The higher temperature HI may be maintained (S982) when the current temperature is set to the higher temperature HI, and the temperature may be increased by 0.5° C. (S981) when the current temperature is not set to the higher temperature HI (e.g., is set to less than the HI).

Additionally, in response to determining from the determination result in step S940 that the drag operation is not performed in the temperature increase direction, the process may proceed to step S960, and whether the current temperature is set to the lower temperature LO may be determined. The lower temperature LO may be maintained (S962) when the current temperature is set to the lower temperature LO, and the temperature may be decreased by 0.5° C. (S961) when the current temperature is not set to the lower temperature LO.

After the temperature is increased by 0.5° C. in step S981 and the temperature is decreased by 0.5° C. in step S961, the process may proceed to steps S990 and S970, and whether the user's touch operation is stopped may be determined. In response to determining from the determination results in steps S990 and S970 that the user's touch operation is not stopped, the process may return to step S940, and whether the drag operation is performed in the temperature increase direction may be determined again.

Meanwhile, in response to determining from the determination result in step S930 that the drag operation is not performed, the process may proceed to step S950, and whether the user's touch operation is the operation for increasing the temperature may be determined. The temperature may be increased by 0.5° C. (S952) in response to determining from the determination result in step S950 that the user's touch operation is the operation for increasing the temperature, and the temperature may be decreased by 0.5° C. (S951) when the user's touch operation is not the operation for increasing the temperature.

While the present invention has been described in detail above with reference to the representative exemplary embodiment, those skilled in the art to which the present invention pertains will understand that the exemplary embodiment may be variously modified without departing from the scope of the present invention. Accordingly, the scope of the present invention should not be limited to the described exemplary embodiment, but should be defined not only by the appended claims but also by all changes or modified forms derived from an equivalent concept to the claims.

What is claimed is:

1. An air conditioning device for a vehicle, comprising:
   a touch input unit which is configured to be touched, rotated by 360 degrees, and dragged by a user;
   a touch sensor unit which includes three channel regions formed by trisecting a rotational region of 360 degrees and configured to detect a capacitance in accordance with touch areas of a first channel, a second channel, and a third channel at predetermined positions in the three channel regions; and
   three channel signal output units configured to output signals from the respective channels in accordance with the detected capacitance.

2. The air conditioning device of claim 1, wherein each of the three channel regions formed by trisecting the rotational region of 360 degrees is implemented in the form of a hook including the rotational region in which only one channel is recognized.

3. The air conditioning device of claim 1, wherein the three channel signal output units are connected to a printed circuit board (PCB) together with two grounded parts.

4. The air conditioning device of claim 1, wherein the detected capacitance is converted into a value of 0 to 255, and the value is transmitted to a controller of the air conditioning device.

5. The air conditioning device of claim 1, wherein the touch sensor unit is formed with predetermined gaps at boundary portions between the three channel regions.

6. The air conditioning device of claim 1, wherein the signals are output from the respective channels in proportion to the touch areas of the first channel, the second channel, and the third channel.

7. A method of controlling an air conditioning device for a vehicle which includes a touch operating unit configured to be touched, rotated by 360 degrees, and dragged by a user, the method comprising:
   storing, by a processor, a predetermined temperature;
   storing, by the processor, a currently set temperature;
   receiving, by the processor, a user touch operation;
   determining, by the processor, whether a drag operation is performed on the touch operating unit after the user touch operation;
   determining, by the processor, whether the drag operation is performed in a temperature increase direction;
   determining, by the processor, whether the current temperature is set to a lower temperature LO in response to determining that the drag operation is performed in the temperature increase direction;
   changing, by the processor, a temperature to the predetermined temperature when the current temperature is set to the lower temperature LO;
   changing, by the processor, the temperature to a higher temperature HI when the current temperature is set to greater than the lower temperature LO;
   determining, by the processor, whether the current temperature is set to the higher temperature HI in response to determining that the drag operation is not performed in the temperature increase direction; and
   in response to determining that the drag operation is not performed in the temperature increase direction, changing, by the processor, the temperature to the predetermined temperature when the current temperature is set to the higher temperature HI, and changing the temperature to the lower temperature LO when the current temperature is set to less than the higher temperature HI.

8. The method of claim 7, further comprising:
   determining, by the processor, whether the user touch operation is a touch operation for increasing the temperature in response to determining that the drag operation is not performed;
   increasing, by the processor, the temperature by 0.5° C. when the user touch operation is the touch operation for increasing the temperature; and decreasing, by the processor, the temperature by 0.5° C. when the user touch operation is not the touch operation for increasing the temperature.

9. A method of controlling an air conditioning device for a vehicle which includes a touch operating unit configured to be touched, rotated by 360 degrees, and dragged by a user, the method comprising:

storing, by a processor, a currently set temperature;

receiving, by the processor, a user touch operation;

determining, by the processor, whether a drag operation is performed after the touch operation;

determining, by the processor, whether the drag operation is performed in a temperature increase direction;

determining, by the processor, whether the current temperature is set to a higher temperature HI in response to determining that the drag operation is performed in the temperature increase direction, maintaining the higher temperature HI when the current temperature is set to the higher temperature HI, and increasing a temperature by 0.5° C. when the current temperature is set to less than the higher temperature HI; and determining, by the processor, whether the current temperature is set to a lower temperature LO in response to determining that the drag operation is not performed in the temperature increase direction, maintaining the lower temperature LO when the current temperature is set to the lower temperature LO, and decreasing the temperature by 0.5° C. when the current temperature is set to greater than the lower temperature LO.

10. The method of claim 9, further comprising:

determining, by the processor, whether the user touch operation is stopped after increasing the temperature by 0.5° C. and decreasing the temperature by 0.5° C.; and returning the process to the determining whether the drag operation is performed after the touch operation when the user touch operation is not stopped.

11. The method of claim 9, further comprising:

determining, by the processor, whether the user touch operation is a touch operation for increasing the temperature in response to determining that the drag operation is not performed;

increasing, by the processor, the temperature by 0.5° C. when the user touch operation is the touch operation for increasing the temperature; and decreasing, by the processor, the temperature by 0.5° C. when the user touch operation is not the touch operation for increasing the temperature.

* * * * *